US007462561B2

(12) United States Patent
Lu et al.

(10) Patent No.: US 7,462,561 B2
(45) Date of Patent: Dec. 9, 2008

(54) CONTACT STRUCTURE FORMED USING SUPERCRITICAL CLEANING FLUID AND ALCVD

(76) Inventors: David Lu, No. 18, Alley 2, Lane 277, Kaocui Road, Hsinchu City (TW); Horng-Huei Tseng, 2 F, No. 18-1, Lane 281, Zhong-Yung Road, HsinChu City (TW); Syun-Ming Jang, 7 F, 83 N. Kuan-Hua Street, Hsin-Chu (TW)

( * ) Notice: Subject to any disclaimer, the term of this patent is extended or adjusted under 35 U.S.C. 154(b) by 352 days.

(21) Appl. No.: 11/044,929

(22) Filed: Jan. 27, 2005

(65) Prior Publication Data

US 2006/0166495 A1 Jul. 27, 2006

(51) Int. Cl.
*H01L 21/44* (2006.01)
*H01L 21/4763* (2006.01)

(52) U.S. Cl. ............... 438/689; 438/745; 257/E21.489; 257/E21.584

(58) Field of Classification Search ................. 438/784, 438/730, 622, 708, 745, 689; 257/E21.489, 257/E21.49, E21.584
See application file for complete search history.

(56) References Cited

U.S. PATENT DOCUMENTS

| | | | | |
|---|---|---|---|---|
| 6,444,495 | B1 | 9/2002 | Leung et al. | |
| 6,852,194 | B2 * | 2/2005 | Matsushita et al. ..... | 156/345.32 |
| 7,250,374 | B2 * | 7/2007 | Gale et al. .................. | 438/745 |
| 2005/0167841 | A1 * | 8/2005 | Papa Rao et al. ............ | 257/758 |
| 2006/0099348 | A1 * | 5/2006 | Narushima et al. .......... | 427/444 |

* cited by examiner

*Primary Examiner*—Caridad M Everhart
(74) *Attorney, Agent, or Firm*—Duane Morris LLP

(57) ABSTRACT

A supercritical fluid such as $CO_2$ cleans an opening formed in a Si-containing dielectric material and removes polymeric and organic residue produced by the etching process used to form the opening. The opening may be a contact, via or other opening and may include a cross-sectional area of less than 0.2 or 0.1 micron square. Atomic layer chemical vapor deposition (ALCVD) is used to form a thin barrier layer within the opening after the supercritical cleaning. A conductive material is formed over the barrier layer to provide a contact structure with improved contact resistance in VLSI devices.

19 Claims, 8 Drawing Sheets

CONTACT STRUCTURE FORMED USING SUPERCRITICAL CLEANING FLUID AND ALCVD

FIELD OF THE INVENTION

The present invention relates to semiconductor fabrication generally, and more particularly to contact structures and methods for forming the same.

BACKGROUND

In today's rapidly advancing semiconductor manufacturing industry, device feature sizes continue to shrink as integration levels increase. Several barriers are being encountered in the attempt to shrink device feature sizes of VLSI (Very Large Scale Integration) devices below the 100 nm range. This is true for both FEOL (front end of line) and BEOL (back end of line) processes. One of the device features that must be reduced in size in order to accommodate VLSI devices in the 100 nanometer range, are the trenches, vias, or contacts formed through dielectric layers and that are filled with conductive interconnect material and which contact underlying conductive features. Such openings are typically formed using plasma etching operations. The plasma etching operation usually creates residue in the opening and it is difficult to remove the residue. As the size of the opening is reduced, it becomes more difficult to remove the residue and the unremoved residue obstructs a larger part of the smaller opening. It would therefore be desirable to provide a method that effectively removes residue from very small openings and allows for good contact to be made to the underlying contact layer when a conductive material is formed in the opening.

Supercritical fluids have been used to clean semiconductor wafers. Supercritical fluid extraction is the name given to a cleaning process that removes contaminants using a supercritical fluid, that is, a gas-like substance above its critical temperature and pressure. Supercritical fluids are fluids at a temperature above which pressure cannot be used to liquefy the fluid. A wafer cleaning system in process using supercritical fluids is disclosed in "Supercritical Fluids For Single Wafer Cleaning", Bok, et al, Solid State Technology, June, 1992, the contents of which are herein incorporated by reference. Supercritical fluids have been found to be effective in cleaning contamination from bare wafers. It would therefore be desirable to use supercritical fluids to clean residue from openings formed through dielectric layers and in conjunction with a subsequent deposition process that forms a barrier layer on the cleaned surfaces of openings, particularly small openings in the less than 100 nanometer range.

SUMMARY OF THE INVENTION

To address these and other needs, and in view of its purposes, an aspect of the invention is a method for forming a semiconductor device that comprises forming and opening that extends into or through a Si-containing dielectric layer, cleaning the opening using a supercritical fluid, depositing a barrier material in the opening using atomic level chemical vapor deposition (ALCVD), and forming a conductive layer over the barrier material. After the opening is formed in the dielectric layer, the dielectric may be optionally cured.

In another aspect, provided is a method for forming a semiconductor device, the method comprising forming an opening through a Si-containing dielectric layer and contacting a subjacent conductive material, cleaning the opening with a supercritical fluid comprising $CO_2$, depositing a barrier material in the opening using atomic layer chemical vapor deposition (ALCVD), forming a conductive layer over the barrier material, polishing to form a conductive plug of the conductive layer in the opening, then forming and patterning a further conductive layer that contacts the conductive plug. After the supercritical cleaning, an optional dielectric liner or sealing layer may be formed prior to barrier layer formation.

BRIEF DESCRIPTION OF THE DRAWING

The present invention is best understood from the following detailed description when read in conjunction of the accompanying drawing. It is emphasized that, according to common practice, the various features of the drawing are not necessarily to scale. On the contrary, the dimensions of the various features are arbitrarily expanded or reduced for clarity. Like numerals denote like features throughout the specification and drawing.

FIG. 1 shows residue formed in an opening formed in a dielectric layer as in the Prior Art;

FIG. 2 shows a supercritical fluid cleaning the opening shown in FIG. 1;

FIG. 3 shows a barrier layer formed using ALCVD after the supercritical cleaning process;

FIG. 4 shows an exemplary seed layer formed over the barrier layer shown in FIG. 3;

FIG. 5 shows a conductive material formed over the barrier layer shown in FIG. 3;

FIG. 6 shows a conductive plug structure formed in the opening by planarizing the structure shown in FIG. 5;

FIG. 7 shows a pattern interconnect lead contacting the conductive plug structure shown in FIG. 6.

DETAILED DESCRIPTION

Methods and structures are described below in which an opening is formed in a dielectric layer, the opening is cleaned with a supercritical fluid, and at least a barrier layer is formed using atomic layer chemical vapor deposition (ALCVD), on the cleaned surfaces. The supercritical fluid removes residue formed by the etching operation used to form the opening and produces a relatively low surface transfer that is especially favorable for porous low-k dielectric materials, in particular cross-linked low-k dielectric materials. The ALCVD process has superior conformity and is particularly advantageous for small feature sizes and high aspect ratios, such as feature sizes less than 100 nm and aspect ratios of 5 or greater.

Figure 1:
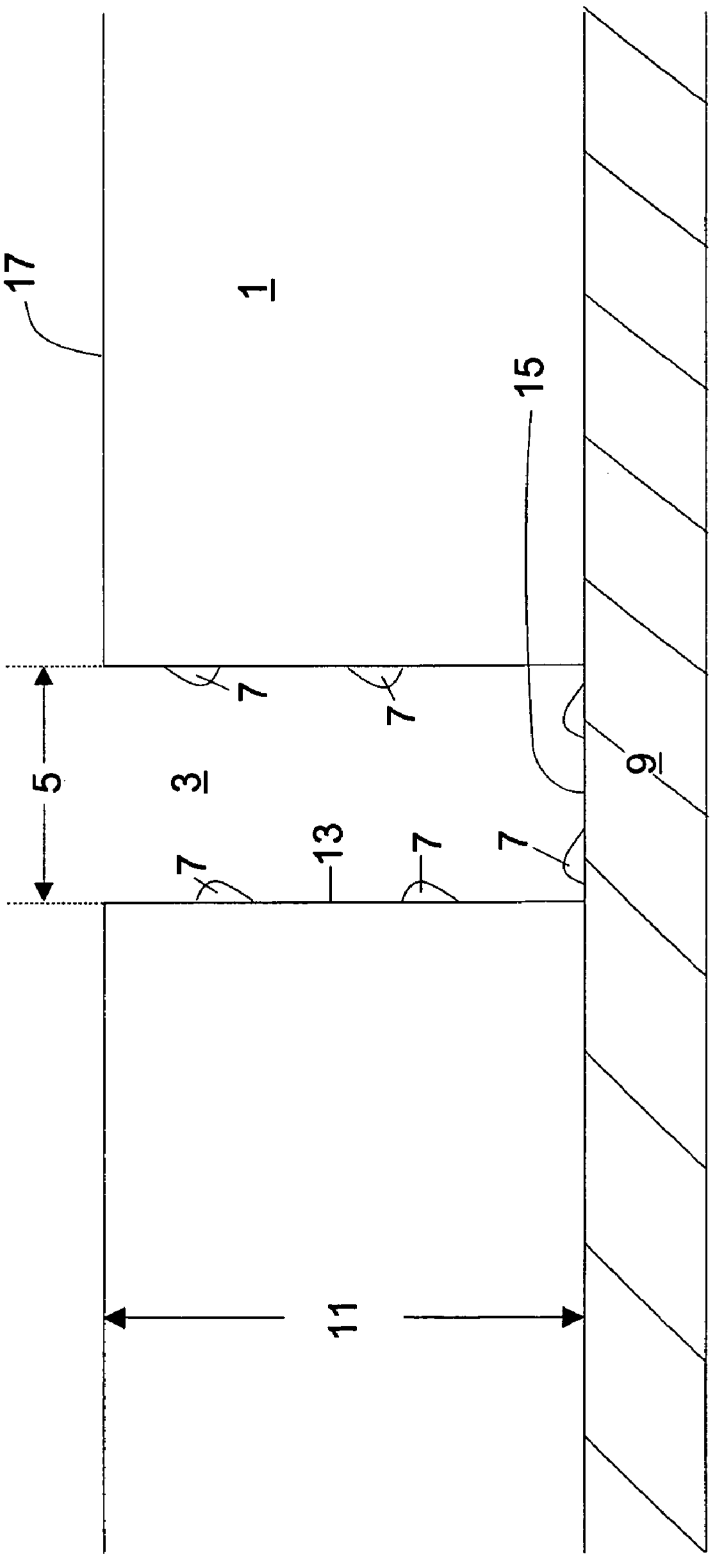
FIGS. 1-7 are cross-sectional views showing various steps using a method for forming a semiconductor device.

FIG. 1 is a cross-sectional view showing Si-containing dielectric layer 1 formed over contact layer 9 which may be a conductive material such as an interconnect metal or a semiconductor material. Opening 3 includes sidewalls 13 and bottom 15 which is an exposed portion of conductive material 9. Conductive material 9 is coupled to devices that are formed at or below the level of conductive material 9. Opening 3 may be a trench, a contact or via opening, or various other openings used in various VLSI devices. Opening 3 includes width 5 which may be less than 100 nanometers in one exemplary embodiment, and less than 70-80 nanometers in another exemplary embodiment. In various exemplary embodiments, opening 3 may be essentially circular, rectangular, or elliptical when viewed from the top view (not shown) and may include an area of less than 0.1 $microns^2$. That is, the area of bottom 15 may be 0.1 $microns^2$ or less. Other dimensions may be used in other exemplary embodiments, however. Thickness 11 of Si-containing dielectric layer 1 may vary in various exemplary embodiments and will depend on device requirements. Si-containing dielectric layer 1 may be a low-k porous material, it may contain organics therein, and it may include oxygen and carbon, such as SiOC. The porous low-k Si-containing dielectric material may be either a closed type material in which k is greater than or equal to 2.2 or an open type material in which k is less than 2.5. Si-containing dielectric layer 1 may have a porosity of greater than 20%. Other silicon-containing dielectric materials may be used in other exemplary embodiments. Si-containing dielectric layer 1 may represent a singly formed film or a plurality of films. Residue 7 is produced during the dry etching operation used to form opening 3. Residue 7 is an etch by-product that is polymeric in nature and typically includes organics. Residue 7 appears on sidewalls 13 and bottom 15 of opening 3 and may also appear on top surface 17 of Si-containing dielectric 1. Sidewalls 13 may be particularly rough when Si-containing dielectric layer 1 has a high porosity.

A curing process may optionally be carried out after formation of Si-containing dielectric layer 1. The curing process may take place before or after opening 3 is formed. The curing process may involve thermal curing, UV-curing, e-beam curing or other radiation curing methods. The curing process may advantageously enhance the bonding, structure and strength of the dielectric and may alter the film structure and/or composition including decreasing the dielectric constant.

Figure 2:
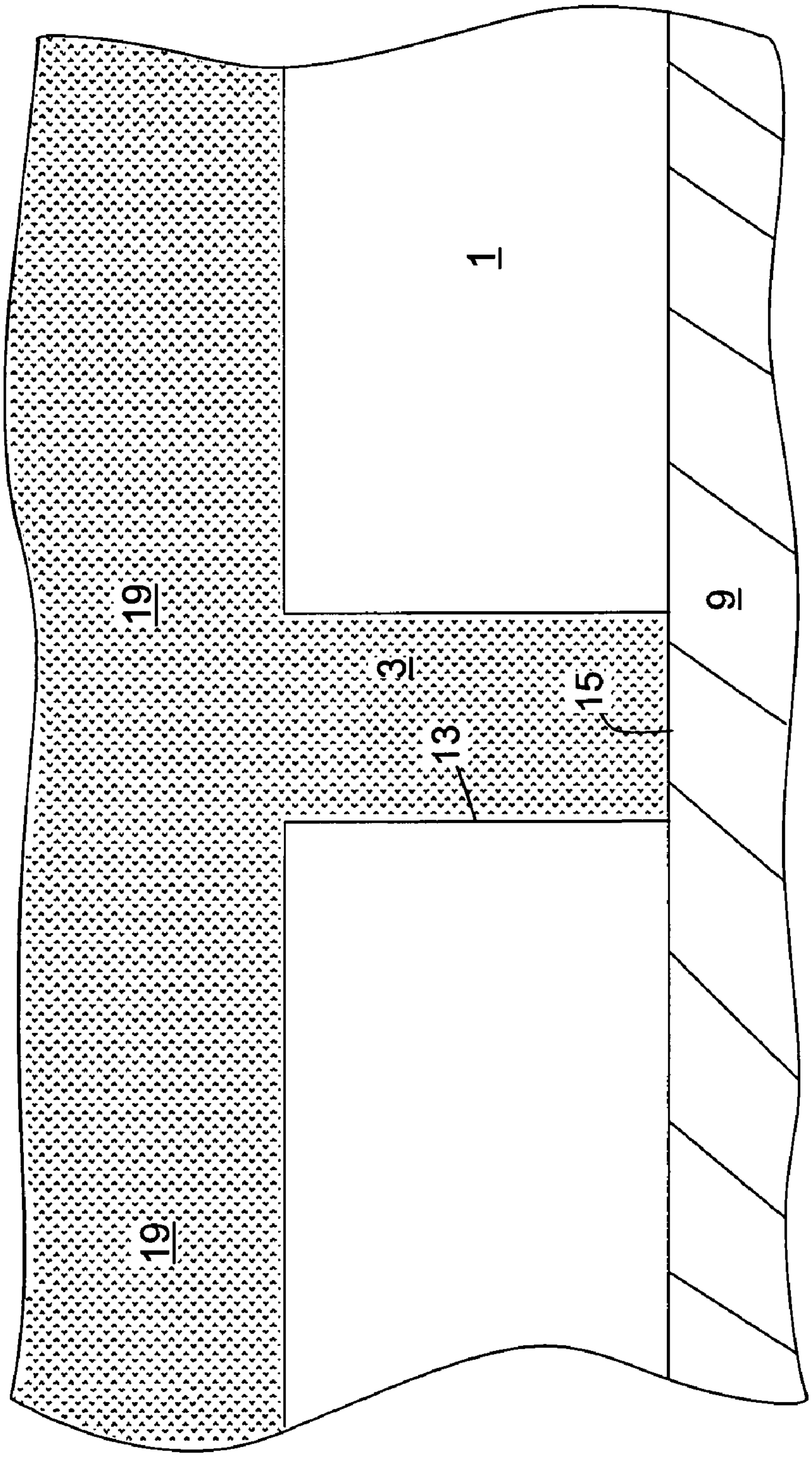

The structure of FIG. 1 is then exposed to a supercritical-phase substance. Supercritical fluid 19 is shown in FIG. 2. In one exemplary embodiment, $CO_2$ may be used as supercritical cleaning fluid 19 but other supercritical fluids such as $O_2$, $O_3$, or $H_2O_2$ may be used in other exemplary embodiments. Methods for creating supercritical fluids are known in the art. Methods for cleaning bulk wafer surfaces using supercritical fluids are disclosed in the previously incorporated article entitled “Supercritical Fluids For Single Wafer Cleaning”, Bok, et al., Solid State Technology, June 1992. Additives may be used to modify the chemical properties, polarity, or solvating power of supercritical fluid 19. For example, $O_2$, $O_3$, or $H_2O_2$ may be added to another supercritical fluid 19 such as $CO_2$ to aid in oxidation of organic contaminants which may be present as residue. Sidewalls 13 and bottom 15 are clear of residue. Suitable process conditions are used to enable supercritical fluid 19 to clean opening 3 by removing residue 7. The supercritical cleaning process is particularly advantageous when Si-containing dielectric layer 1 is porous.

Figure 3:
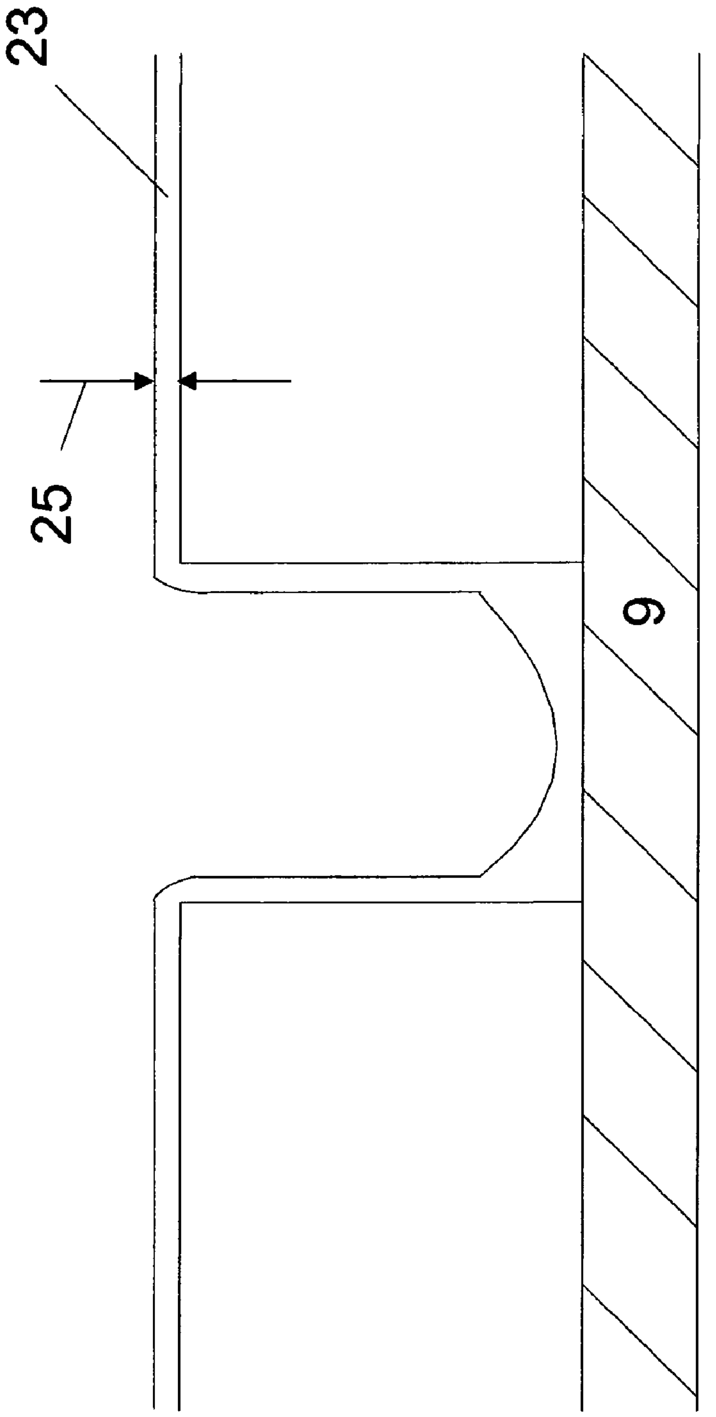
Figure 8:
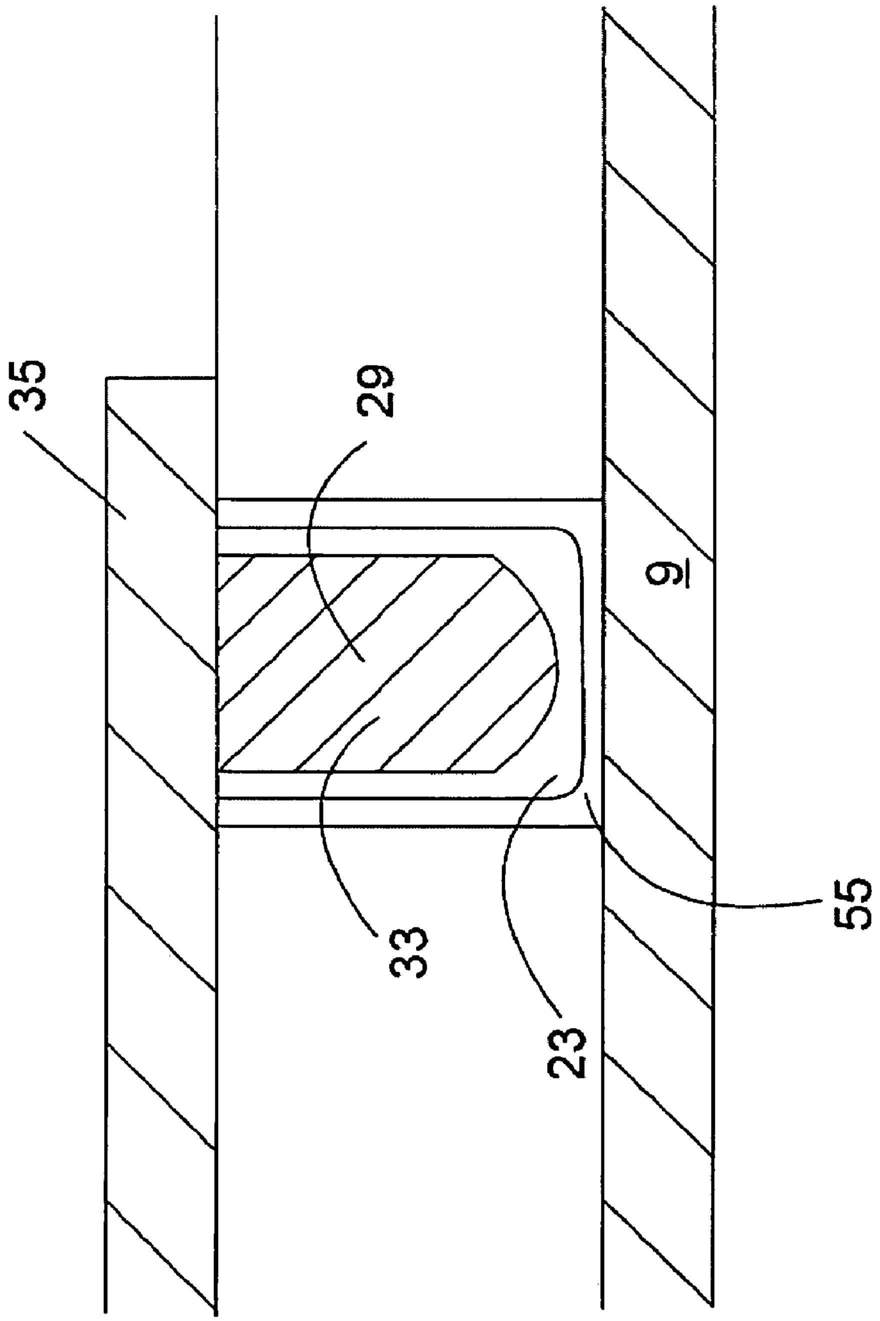
FIG. 8 shows another exemplary structure of the invention.

FIG. 3 shows the structure of FIG. 2 after supercritical fluid 19 has been removed and barrier layer 23 formed. Barrier layer 23 is preferably formed using atomic layer chemical vapor deposition (ALCVD) and may be formed immediately subsequent the supercritical fluid clean. In one embodiment, to ensure the surface quality of Si-containing dielectric layer 1 treated by supercritical fluid 19, barrier layer 23 is formed in-situ with the supercritical cleaning process step and without being exposed to air. To further enhance adhesion between Si-containing dielectric layer 1 and barrier layer 23, a thin dielectric liner layer such as ALCVD silicon oxide may be formed before deposition of barrier layer 23. The dielectric liner material may include a thickness of less than 300 angstroms and be a further Si-containing dielectric, a self-sealing dielectric, an organic material or another dielectric that includes a density greater than that of the Si-containing dielectric layer 1, and thin dielectric liner layer may be formed immediately following and in-situ with the supercritical cleaning process step and without being exposed to air. An example of the optional thin dielectric layer is shown in FIG. 8. The dielectric liner may serve as a sealing layer and may be formed by plasma treatment or other suitable processes. The optional plasma treatment may serve as a pore sealing process to avoid the penetration or encroachment of subsequently deposited films such as barrier layer 23, into Si-containing dielectric layer 1. In yet another exemplary embodiment, an additional plasma treatment may take place between the supercritical fluid cleaning and the ALCVD formation of barrier layer 23. Barrier layer 23 may be titanium, tantalum, TiN, TaN, other titanium or tantalum containing compounds, or other suitable refractory metals. Barrier layer 23 formed using ALCVD may include thickness 25 less than 200 angstroms in one embodiment and in another exemplary embodiment, thickness 25 may be 100 angstroms or less. A conductive material will be formed over barrier layer 23, as will be shown in FIG. 5.

Figure 4:
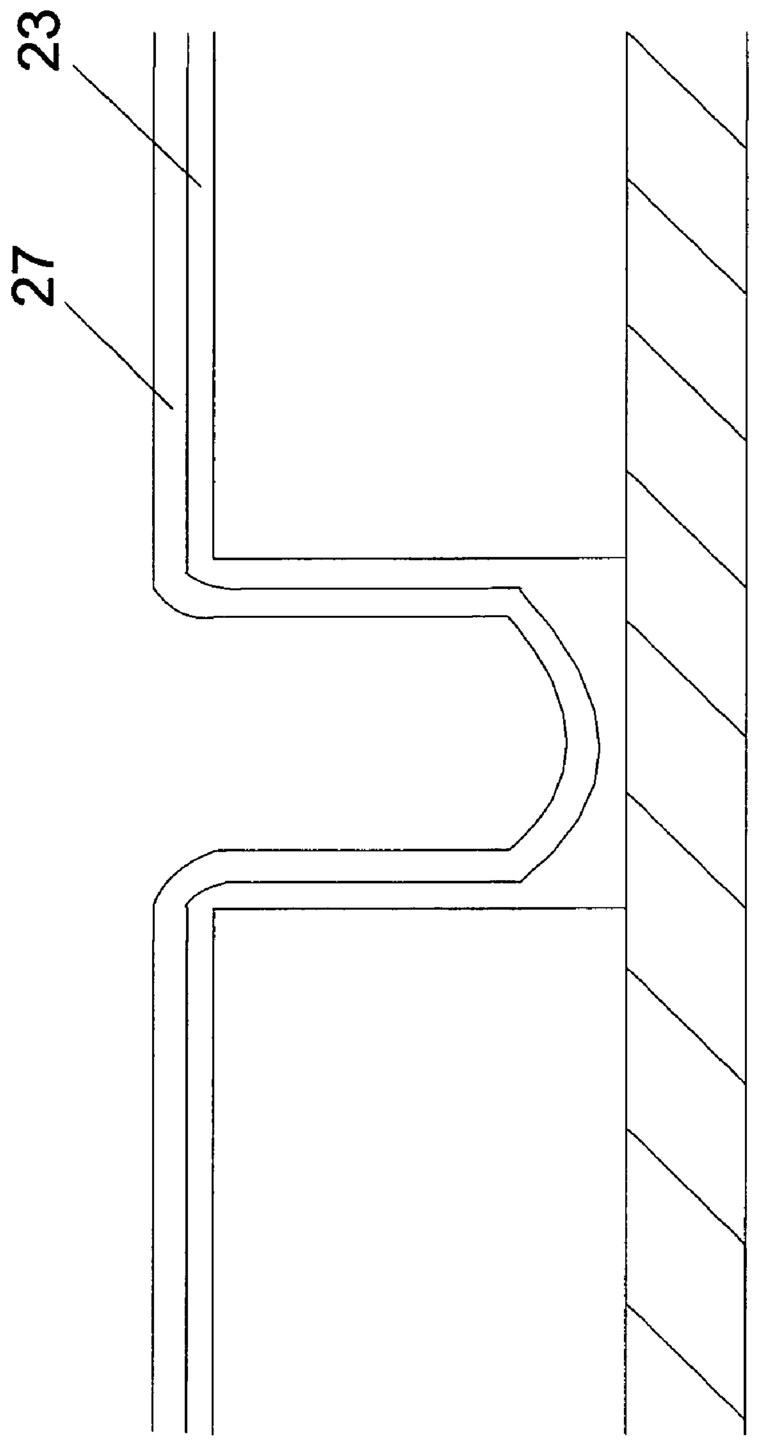

In one exemplary embodiment, a further layer such as seed layer 27 shown in FIG. 4, may be formed over barrier layer 23. Various conventional seed layers may be used and in another exemplary embodiment the further layer may be another suitable interlevel conductive material or a further barrier material that may be formed by ALCVD or other means. In another exemplary embodiment, further layer 27 may not be used.

Figure 5:
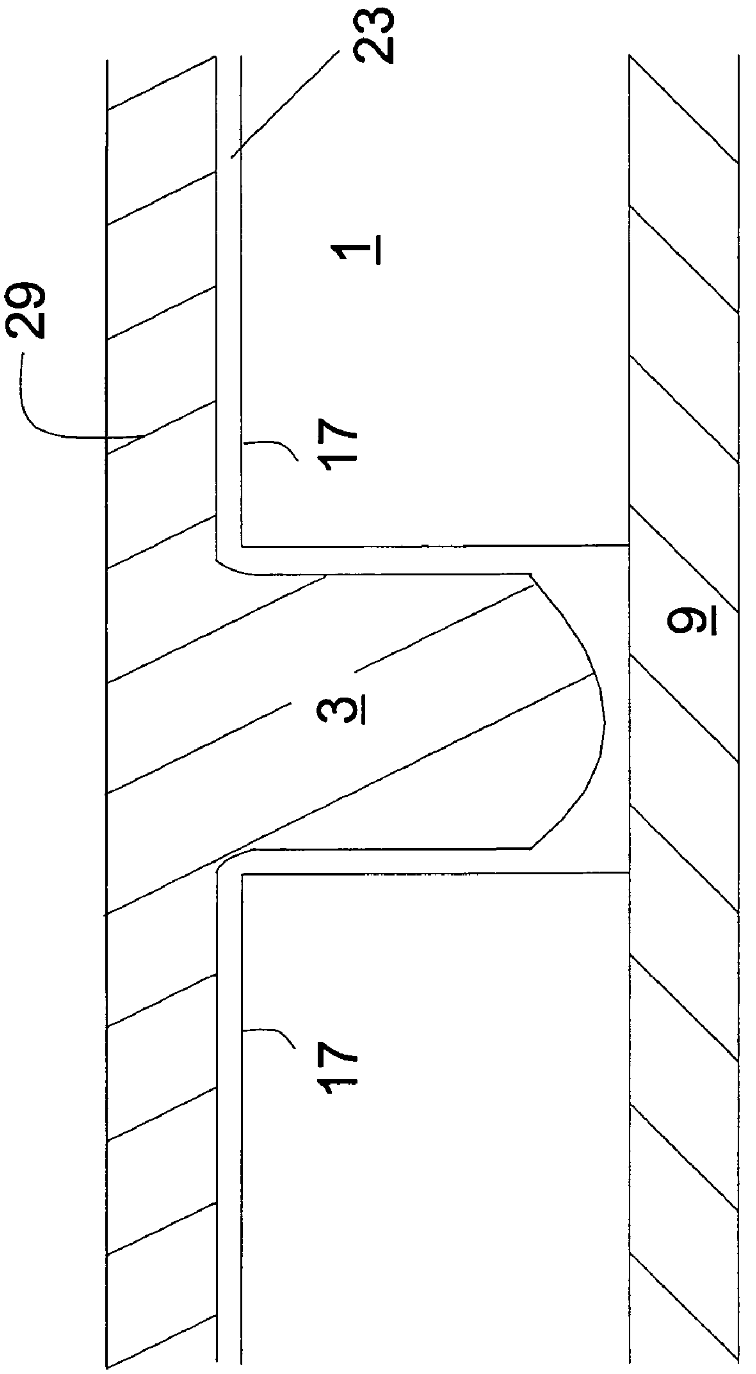

FIG. 5 shows the structure of FIG. 3 after conductive material 29 is formed. Conductive material 29 is formed over surface 17 of Si-containing dielectric 1 and filling opening 3. Conductive material 29 may be copper, aluminum, platinum or combinations or alloys thereof. Conductive material 29 may be formed using conventional techniques and it fills opening 3 to form a conductive plug. The plug contacts subjacent conductive material 9.

Figure 6:
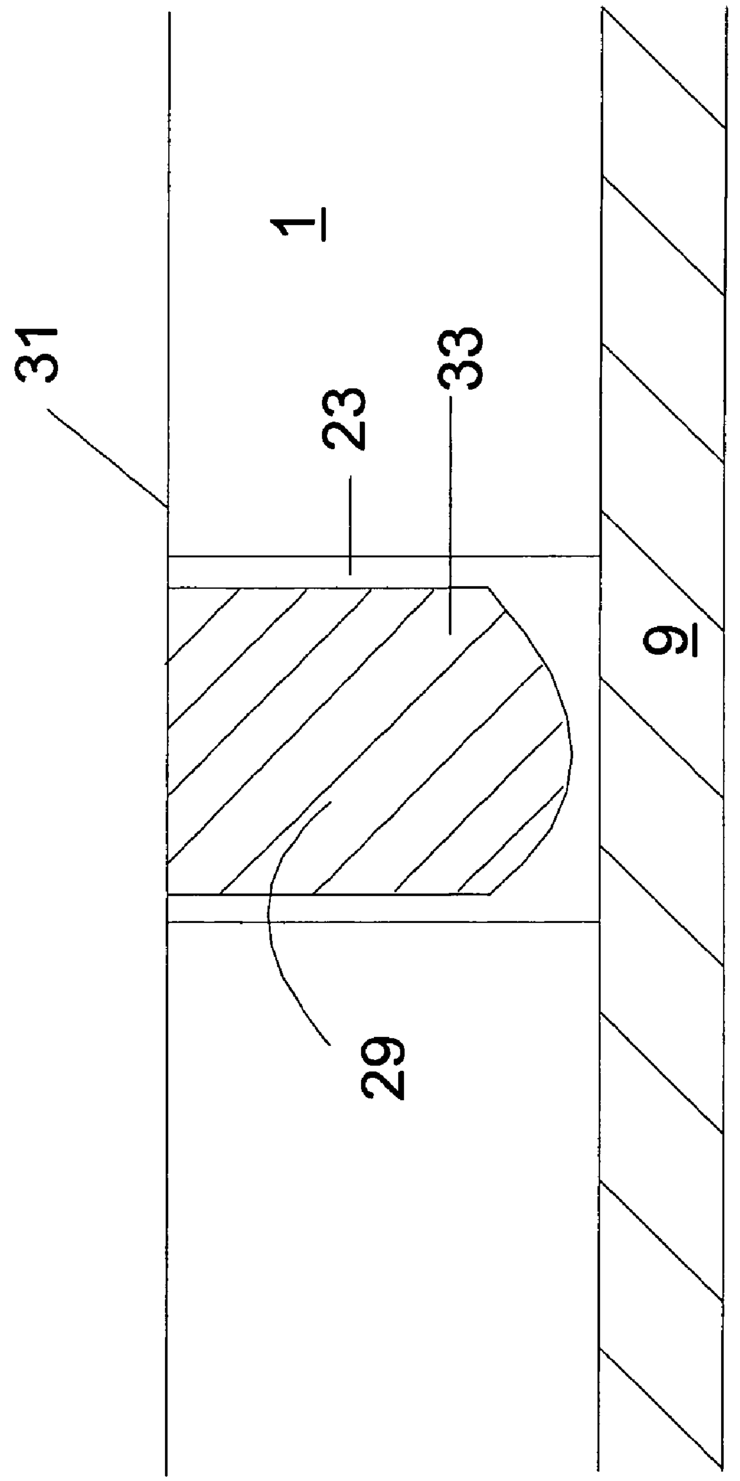

FIG. 6 shows the structure of FIG. 5 after an optional polishing procedure is carried out to planarized the structure. Chemical mechanical polishing, CMP, or other polishing techniques may be used to form planar upper surface 31. Conductive plug 33 includes barrier layer 23 and conductive material 29 and in another exemplary embodiment such as may be formed from the substructure shown in FIG. 4, additional materials may be present.

Figure 7:
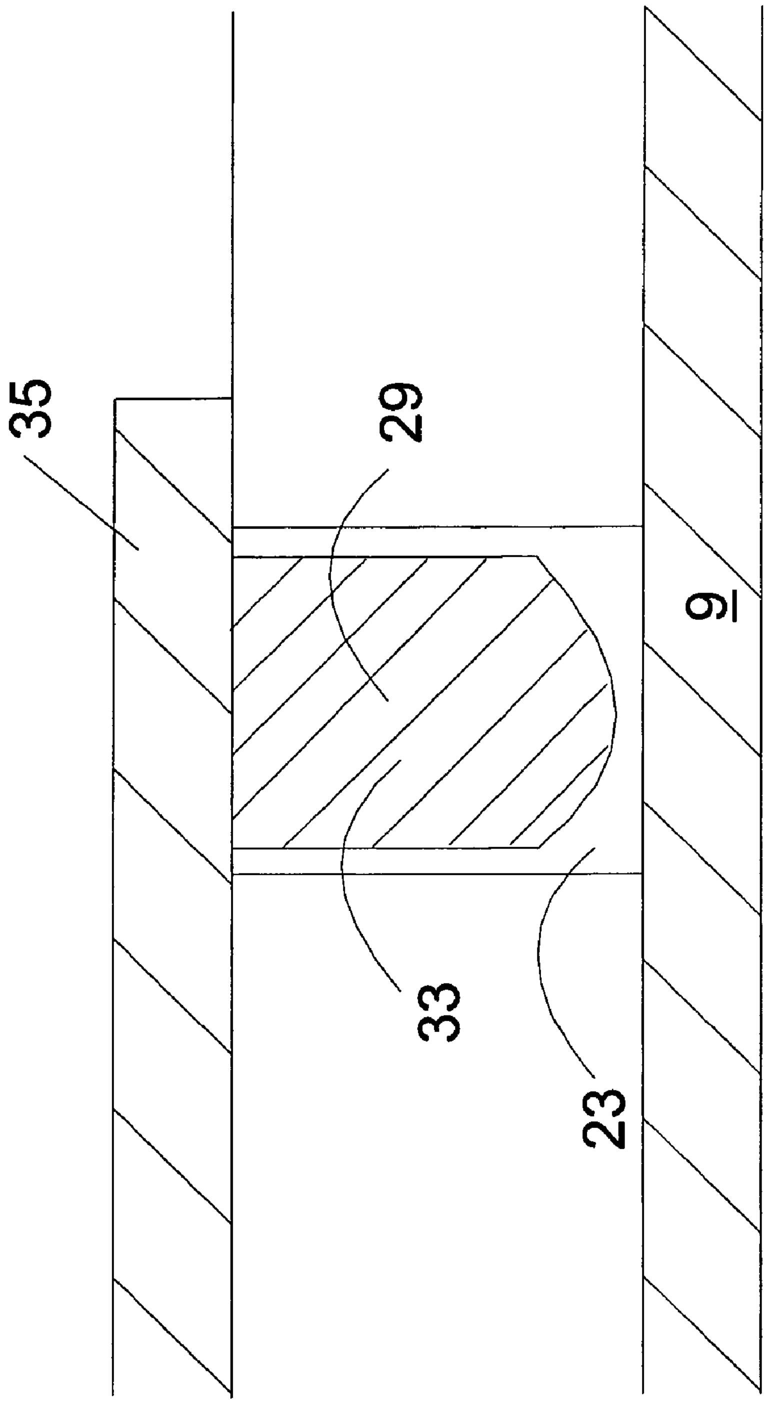

Conductive plug 33 is then used to electrically connect subjacent conductive layer 9 to further features. For example, FIG. 7 shows patterned interconnect layer 33 formed over Si-containing dielectric layer 1 and patterned using conventional materials and methods. Patterned interconnect layer 33 is electrically coupled to subjacent conductive layer 9 by conductive plug 33. Contact resistance and other device parameters are improved due to the superior cleaning and ALCVD process that results in the deposited film being formed in a residue-free opening.

FIG. 8 shows a structure that is similar to the structure shown in FIG. 7, but includes previously described, optional thin dielectric layer 55 formed prior to and below barrier layer 23.

The preceding merely illustrates the principles of the invention. It will thus be appreciated that those skilled in the art will be able to devise various arrangements which, although not explicitly described or shown herein, embody the principles of the invention and are included within its spirit and scope. Furthermore, all examples and conditional language recited herein are principally intended expressly to be only for pedagogical purposes and to aid the reader in understanding the principles of the invention and the concepts contributed by the inventors to furthering the art, and are to be construed as being without limitation to such specifically recited examples and conditions. Moreover, all statements herein reciting principles, aspects, and embodiments of the invention, as well as specific examples thereof, are intended to encompass both structural and functional equivalents thereof. Additionally, it is intended that such equivalents include both currently known equivalents and equivalents developed in the future, i.e., any elements developed that perform the same function, regardless of structure.

This description of the exemplary embodiments is intended to be read in connection with the figures of the accompanying drawing, which are to be considered part of the entire written description. In the description, relative terms such as "lower," "upper," "horizontal," "vertical,", "above," "below," "up," "down," "top" and "bottom" as well as derivatives thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A method for forming a semiconductor device comprising:

forming an opening that extends at least into a Si-containing dielectric layer;

cleaning said opening with a supercritical fluid;

conducting a pore sealing plasma treatment process after said cleaning;

after said conducting, depositing a barrier material in said opening using atomic layer chemical vapor deposition (ALCVD); and forming a conductive layer over said barrier material.

2. The method as in claim 1, wherein said Si-containing dielectric layer includes a dielectric constant (k) less than about 2.5.

3. The method as in claim 1, wherein said forming an opening comprises etching and results in residue formed in said opening and wherein said cleaning removes said residue from said opening.

4. The method as in claim 1 wherein said barrier material comprises one of Ti, Ta, a Ti-containing compound, a Ta-containing compound, Ru, a Ru-containing compound, and one or a compound of further refractory metals.

5. The method as in claim 1, wherein said forming an opening comprises forming an opening through said Si-containing dielectric layer and said opening has a bottom that comprises a conductive material and includes and a cross-sectional area no greater than 0.01 micron square.

6. The method as in claim 1, wherein said Si-containing dielectric layer comprises a low-k dielectric layer.

7. The method as in claim 6, further comprising curing said Si-containing dielectric layer.

8. The method as in claim 1, wherein said supercritical fluid comprises $CO_2$.

9. The method as in claim 8, wherein said supercritical fluid further comprises at least one of $O_2$, $O_3$, and $H_2O_2$.

10. The method as in claim 1, further comprising forming a dielectric liner before said depositing a barrier material.

11. The method in claim 10, wherein said dielectric liner comprises a Si-containing material or organic material and has a thickness less than about 300A.

12. The method as in claim 10, wherein said dielectric liner comprises at least one of a Si-containing dielectric material, a self-sealing dielectric and a dielectric with a density greater than a density of said Si-containing dielectric layer.

13. The method as in claim 10, wherein an average porosity of said Si-containing dielectric layer is substantially larger than 20%.

14. A method for forming a semiconductor device comprising:

forming an opening that extends at least into a Si-containing dielectric layer;

cleaning said opening with a supercritical fluid;

conducting a plasma treatment after said cleaning;

after said conducting a plasma treatment, depositing a barrier material in said opening using atomic layer chemical vapor deposition (ALCVD); and forming a conductive layer over said barrier material, wherein said supercritical fluid comprises at least one of $O_2$, $O_3$, and $H_2O_2$.

15. A method for forming a semiconductor device comprising:

forming an opening through a Si-containing dielectric layer with a dielectric constant (k) value less than about 2.5 and contacting a subjacent conductive material;

cleaning said opening with a supercritical phase substance to remove polymeric etch residue from said opening:

depositing a barrier material in said opening using atomic layer chemical vapor deposition (ALCVD);

forming a conductive layer over said barrier material and filling said opening;

polishing to form a conductive trench, via or contact of said conductive layer in said opening; then forming and patterning a further conductive layer that contacts said conductive plug.

16. The method as in claim 15, further comprising curing said Si-containing dielectric layer before said forming.

17. The method in claim 15, further comprising plasma treatment after said cleaning and before said depositing.

18. The method as in claim 15, further comprising forming a dielectric liner before said depositing a barrier material.

19. The method as in claim 18, wherein said forming a dielectric liner comprises ALCVD.

* * * * *

UNITED STATES PATENT AND TRADEMARK OFFICE

CERTIFICATE OF CORRECTION

PATENT NO. : 7,462,561 B2
APPLICATION NO. : 11/044929
DATED : December 9, 2008
INVENTOR(S) : David Lu, Horng-Huei Tseng and Syun-Ming Jang It is certified that error appears in the above-identified patent and that said Letters Patent is hereby corrected as shown below:

Title page, item [75] “inventors:” replace “Kaocui” with --Gaocui--

Signed and Sealed this

Nineteenth Day of May, 2009

JOHN DOLL
*Acting Director of the United States Patent and Trademark Office*